United States Patent [19]

Kaneko

[11] Patent Number: 5,323,357
[45] Date of Patent: Jun. 21, 1994

[54] NOISE-FREE SEMICONDUCTOR MEMORY DEVICE CAPABLE OF DISCONNECTING WORD LINE DECODER FROM GROUND TERMINAL

[75] Inventor: Shouji Kaneko, Kanagawa, Japan
[73] Assignee: NEC Corporation, Tokyo, Japan
[21] Appl. No.: 858,191
[22] Filed: Mar. 26, 1992

[30] Foreign Application Priority Data

Mar. 26, 1991 [JP] Japan ................... 3-086248

[51] Int. Cl.⁵ ............. G11C 7/02; G11C 8/00
[52] U.S. Cl. ................ 365/230.06; 365/203; 365/206; 365/207; 365/208; 365/190; 307/449; 307/463
[58] Field of Search ............ 365/203, 206, 207, 208, 365/230.06, 230.01, 190, 228; 307/449, 463

[56] References Cited

U.S. PATENT DOCUMENTS

| | | | |
|---|---|---|---|
| 4,048,629 | 9/1977 | Bormann | 365/203 |
| 4,200,917 | 4/1980 | Moench | 307/449 |
| 4,259,731 | 3/1981 | Moench | 365/206 |
| 4,275,312 | 6/1981 | Saitou et al. | 307/463 |
| 4,620,299 | 10/1986 | Remington et al. | 365/230 |
| 4,651,031 | 3/1987 | Kamuro | 365/230.06 |
| 4,827,160 | 5/1989 | Okano | 307/449 |
| 5,245,583 | 9/1993 | Li et al. | 365/230.06 |
| 5,262,687 | 11/1993 | Benhamida | 307/452 |

FOREIGN PATENT DOCUMENTS

| | | | |
|---|---|---|---|
| 2853204 | 6/1979 | Fed. Rep. of Germany | 307/449 |
| 1-52285 | 2/1989 | Japan | 365/230.01 |

Primary Examiner—Eugene R. LaRoche
Assistant Examiner—Andrew Tran
Attorney, Agent, or Firm—Sughrue, Mion, Zinn, Macpeak & Seas

[57] ABSTRACT

A semiconductor memory circuit according to the present invention comprises a decode circuit responsive to an internal address for generating a signal of a predetermined level, a drive circuit responsive to a word line activating signal for generating a word line selection signal corresponding to an output level of the decode circuit and a shutdown circuit responsive to a control signal for disconnecting the decode circuit from a ground terminal.

With this construction, since the decode circuit is disconnected from the ground terminal during a time period for which a memory sense amplifier operates, an output level of the word line selection signal is not affected by noise even if the latter is generated on the ground line during that period. Therefore, it is possible to keep the memory cell in a stable selection state.

11 Claims, 2 Drawing Sheets

NOISE-FREE SEMICONDUCTOR MEMORY DEVICE CAPABLE OF DISCONNECTING WORD LINE DECODER FROM GROUND TERMINAL

BACKGROUND OF THE INVENTION

1. Field of the Invention

The present invention relates to a semiconductor memory circuit and, particularly, to a word selection circuit for activating a predetermined word line selection signal according to an address internal signal.

2. Description of the Prior Art

In a semiconductor memory circuit having a memory cell array including memory cells arranged in array, a word line selection circuit is one of circuit constructions for selecting a memory cell corresponding to an input address. The word line selection circuit receives an internal address corresponding to an address inputted externally and activates one of a plurality of word line selection signals in order to select a predetermined word line.

Generally, the word line selection circuit includes, for each word line selection signal, a decode circuit responsive to an internal address for generating a signal having a predetermined level, a drive circuit responsive to a word line activating signal for outputting a signal corresponding to an output level of the decode circuit as a word line selection signal and a precharge circuit for precharging an input point of the drive circuit to a power source voltage. Therefore, the number of such word line selection circuits corresponds to the number of word line selection signals.

With an internal signal supplied to the respective decode circuits of the word line selection circuits, an output of one of the decode circuits is maintained at high level (power source voltage level) while outputs of the remaining decode circuits are changed to low level (ground voltage level). Then, when the word line activating signal becomes high level, one of the drive circuits generates a high level, activated word line selection signal and the remaining drive circuits generate low level word line selection signals. Thus, the word line signal corresponding to the internal address is activated.

When the word line selection signal is activated in this manner, a word line corresponding thereto is driven and a memory cell connected to the word line is selected. Then, an information read out from the thus selected memory cell is amplified by a sense amplifier and a readout data is outputted.

In this case, when the sense amplifier amplifies the input information, large current flows through the ground line. As a result, a condition where a potential of the ground line rises from 0 V occurs, that is, noise is generated in the ground line.

When such noise is generated, the output levels of the decode circuits which are low are rised. Therefore, output levels of the associated drive circuits are also rised while the level of the activated word line selection signal is lowered, causing a memory cell selection to become unstable.

BRIEF SUMMARY OF THE INVENTION

Object of the Invention

Therefore, an object of the present invention is to provide a word line selection circuit by which a level of a word line selection signal is not influenced by noise generated in a ground line during a sense amplifier amplifies an input information from a selected memory cell.

Summary of the Invention

A semiconductor memory circuit according to the present invention comprises, for each word line selection signal, a decode circuit responsive to an internal address for generating a signal of predetermined level, a drive circuit responsive to a word line activating signal for outputting a word line selection signal corresponding to an output level of the decode circuit and a shutdown circuit responsive to a control signal for cutting off between the decode circuit and a ground terminal.

The decode circuit comprises a plurality of transistors connected in parallel to each other between an input terminal of the drive circuit and a node. The transistors have gates which receive the internal address.

The shutdown circuit comprises a transfer gate provided between the node and the ground terminal. The transfer gate has a control terminal to which the control signal is supplied.

The drive circuit comprises a first transistor and a second transistor which are connected in series with each other between an input terminal of the word line activating signal at voltage level not less than a power source voltage and the ground terminal. The output of the decode circuit is supplied to the gate of the first transistor and an inverted output of the decode circuit is supplied to the gate of the second transistor. A junction between the first and second transistors constitutes an output terminal of the word line selection signal.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein.

DETAILED DESCRIPTION OF THE INVENTION

Figure 1:
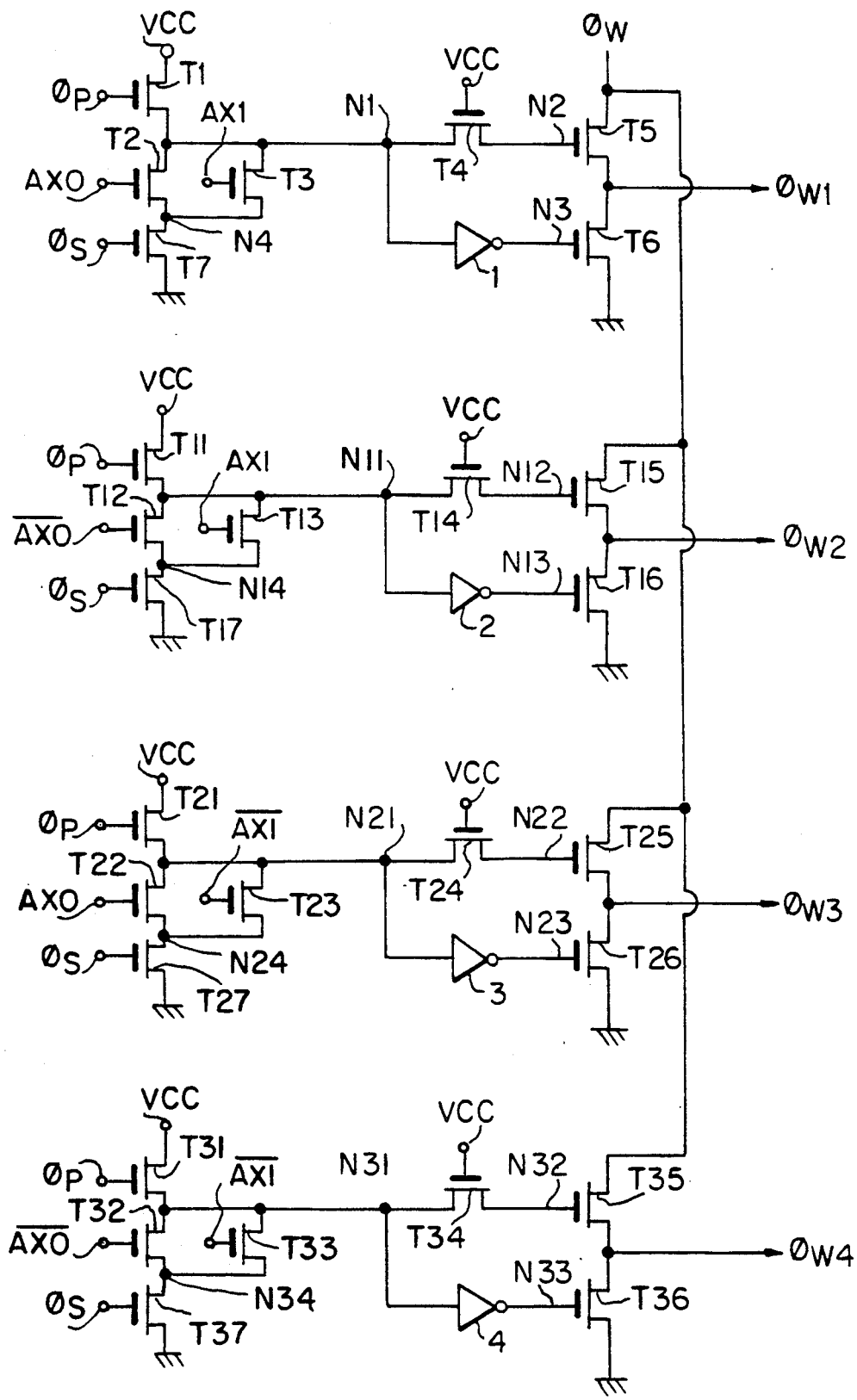
FIG. 1 is a circuit diagram showing a concrete circuit construction of a word line selection circuit according to the present invention.

An embodiment of the present invention will be described with reference to FIG. 1. In this embodiment, it is assumed that an internal address to be generated according to an input address includes 2 bits, Ax0 and Ax1, and there are 4 word line selection signals $\phi w1$-$\phi w4$.

The word line selection circuit comprises, for each word line selection signal, a decode circuit responsive to an internal address for generating a signal of predetermined level, a drive circuit responsive to a word line activating signal for outputting a word line selection signal corresponding to an output level of the decode circuit, a precharge circuit for precharging an input point of the drive circuit to a power source voltage and a shutdown circuit responsive to a control signal for cutting off between the decode circuit and a ground terminal. The shutdown circuit is a feature of the present invention.

Describing a portion of this circuit in which the word line selection signal $\phi w1$ is generated, the decode circuit includes N channel transistors T2 and T3 which are connected i parallel between nodes N1 and N4 and gates of which receive the internal address bits Ax0 and Ax1, respectively. This decode circuit functions as a NOR circuit for the internal address bits Ax0 and Ax1. The precharge circuit includes a P channel transistor T1 connected between a power source terminal Vcc and the node N1 and having a gate to which a precharge signal $\phi p$ is supplied. The drive circuit includes an N channel transistor T5 having a gate connected through an N channel transistor T4 to the node N1 and an N channel transistor T6 having a gate connected through an inverter circuit 1 to the node N1. The transistors T5 and T6 are connected in series with each other between a ground terminal and a terminal to which the word line activating signal $\phi w$ is supplied and a junction between the transistors T5 and T6 is used as an output point of the word line selection signal $\phi w1$. Further, the shutdown circuit includes an N channel transistor having a gate to which a control signal $\phi s$ is supplied and connected between a node N4 and the ground line. In the case of this embodiment, the control signal $\phi s$ is an inverted signal of a sense amplifier activating signal (not shown).

A circuit portion for generating the word line selection signals $\phi w2-\phi w4$ is the same as that mentioned above, except that signals to be supplied to the decode circuits are a combination of the internal address Ax0 and Ax1 and inversions thereof.

Figure 2:
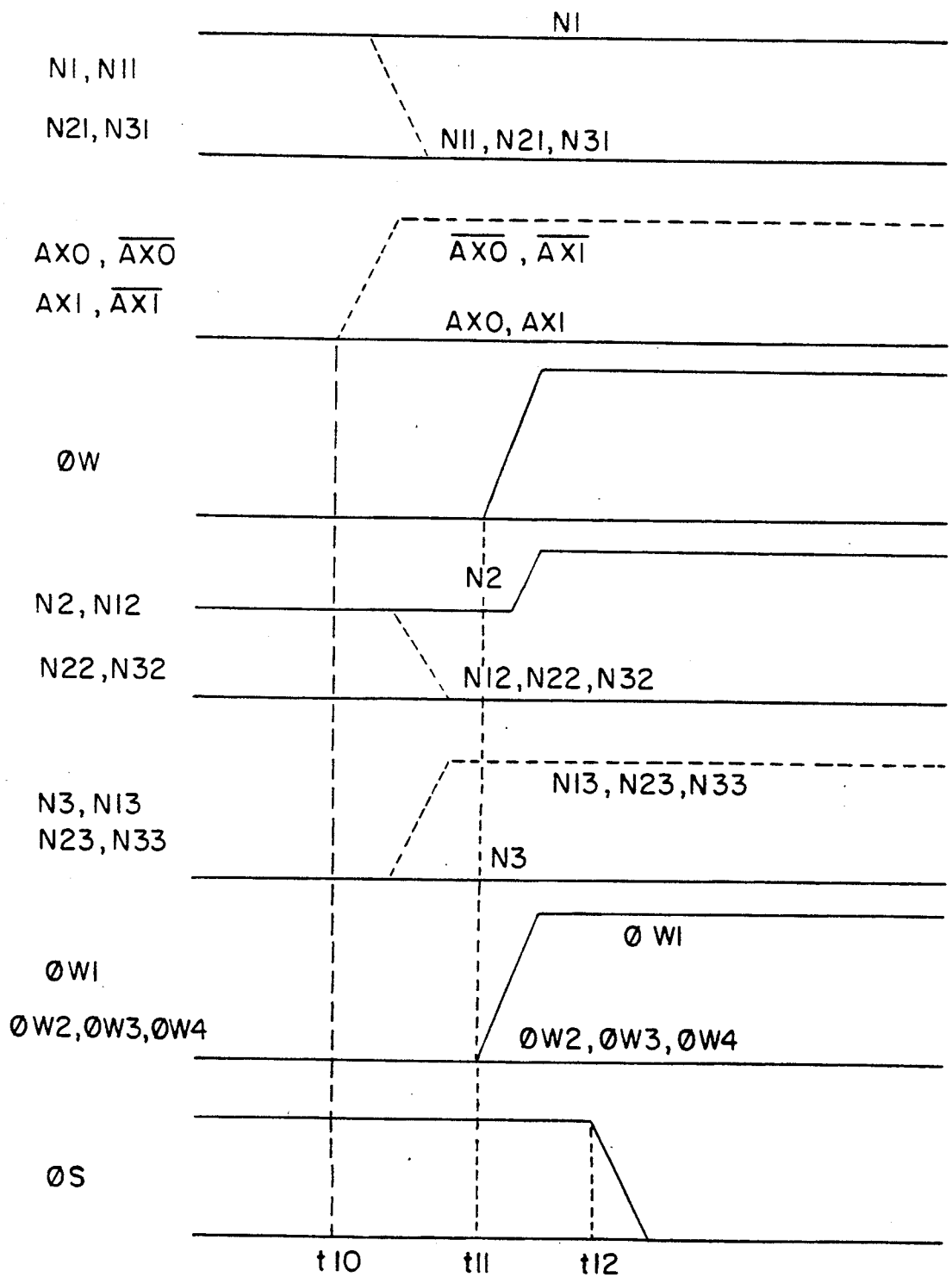
FIG. 2 shows waveforms useful to understand an operation of the circuit shown in FIG. 1.

An operation of the circuit shown in FIG. 1 will be described with reference to FIG. 2. In this description, it is assumed that the word line selection signal $\phi w1$ is selected and activated.

The internal address bits Ax0 and Ax1 are low level before a start of selection operation and potentials at nodes N1, N11, N21 and N31 are made high level by means of respective precharge circuits T1, T11, T21 and T31. Therefore, nodes N2, N12, N22 and N32 are high level and nodes N3, N13, N23 and N33 are low level. Further, since the control signal $\phi s$ is high level, the N channel transistors T7, T17, T27 and T37 which constitute the shutdown circuits are in ON state and, thus, nodes N4, N14, N24 and N34 are low level.

P channel transistors T1, T11, T21 and T31 are turned off when the precharge signal $\phi p$ becomes high level. In this state, the internal address bits Ax0 and Ax1 are made low level to select the word line selection signal $\phi w1$. Therefore, the N channel transistors T2 and T3 constituting one decode circuit are turned off and thus the node N1 is kept high level. Therefore, the node N2 and the node N3 are kept high level and low level, respectively.

However, since the N channel transistors T12, T23, T32 and T33 are turned on, the nodes N11, N21 and N31 become low level. With these changes of state, the nodes N12, N22 and N32 change their states from high level to low level and the nodes N13, N23 and N33 are changed from low level to high level (see time instant t10 in FIG. 2).

Then, when the word line activating signal $\phi w$ becomes as high as or higher than the source voltage (see time instant t11 in FIG. 2), potential at the node N2 increases to a level equal to or higher than the source voltage due to the self boot effect of the transistor T5. Therefore, the word line selection signal $\phi w1$ becomes high level equal to or higher than the source voltage, that is, it is activated. On the other hand, since the nodes N12, N22 and N32 are low level, the transistors T15, T25 and T35 are turned off and, since the nodes N13, N23 and N33 are high level, the transistors T16, T26 and T36 are turned on, while other word line selection signals are kept low level.

Thereafter, a word line corresponding thereto is driven and a memory cell (not shown) connected thereto is selected. As mentioned previously, when data read out from the memory cell is amplified by a sense amplifier (not shown), large current flows through the ground line and thus potential thereof is rised temporarily from 0 V resulting in ground line noise.

In this invention, however, the control signal $\phi s$ which is an inverted signal of a sense amplifier activating signal becomes low level when the sense amplifier operates (see time instant t12 in FIG. 2) and thus the N channel transistors T7, T17, T27 and T37 constituting the shutdown circuits are turned off. Therefore, all of the decode circuits are disconnected from the ground line. As a result, the nodes N1, N11, N21 and N31 are disconnected from the ground line electrically and thus voltage levels of the word line selection signals $\phi w1-\phi w4$ are not changed.

When an amplified readout data is outputted by the sense amplifier and a readout operation completes, the control signal $\phi s$ becomes high level (not shown) again and the precharge signal $\phi p$ becomes low level. Therefore, the nodes N1, N11, N21 and N31 become high level by means of the precharge circuits T1, T11, T21 and T31.

As is clear from the operation mentioned above, in the word line selection circuit according to this embodiment, the output level of the word line selection signal is not affected by noise generated in the ground line during operation of the memory sense amplifier, since the decode circuits are shutdown with respect to the ground line. Therefore, it is possible to keep the memory cell in a stable selecting condition.

In the described embodiment, the control signal $\phi s$ is obtained by inverting the sense amplifier activating signal. However, any other signal may be used with the same effect provided that its state is changed (from high to low or vice versa) during a time period from an instance at which any of the word line selection signals $\phi w1-\phi w4$ becomes fully high level to a start of operation of the sense amplifier.

Further, although, in this embodiment, the decode circuit has an NOR circuit construction, the present invention is not limited thereto. For example, the decode circuit may has a NAND circuit construction.

Although the present invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory circuit having a plurality of word lines, a decoder circuit responding to a set of address signals to select one of said word lines, and a sense amplifier amplifying, when activated, data read out from a memory cell connected to said one of said word lines selected by said decoder circuit, said decoder circuit comprising a plurality of decoding circuits individually provided for each of said word lines and responsive to a part of said set of address signals for outputting one of a selection level and a non-selection level, a plurality of driving circuits each coupled between an associated one of said decoding circuits and an associated one of said word lines and responsive to a word line activating signal for selecting said associated one of said word lines when said associated one of said decoding circuits outputs said selection level, and a plurality of switches each connected between an associated one of said decoding circuits and a ground terminal, each of said switches being rendered nonconductive when said sense amplifier is activated to disconnect each of said decoding circuits from said ground terminal so that each of said decoding circuits is free from a noise voltage appearing on said ground terminal caused by an amplifying operation of said sense amplifier.

2. The semiconductor memory circuit as claimed in claim 1, wherein said sense amplifier is supplied with a sense amplifier activating signal and is activated during an active level of said sense amplifier activating signal, and each of said switches is supplied with an inverted signal of said sense amplifier activating signal and rendered nonconductive during said active level of said sense amplifier activating signal.

3. The semiconductor memory circuit as claimed in claim 2, wherein each of said decoding circuits comprises a plurality of transistors each having a gate supplied with one of said part of said set of address signals, said transistors being connected in parallel to each other between an input terminal of an associated one of said driving circuits and a node.

4. The semiconductor memory circuit as claimed in claim 3, wherein each of said switches comprises a transfer gate having a control terminal supplied with said inverted signal of said sense amplifier activating signal and provided between said node and said ground terminal.

5. The semiconductor memory circuit as claimed in claim 2, wherein each of said driving circuits comprises a series connection of a first transistor and a second transistor, said series connection being connected between an input terminal for said word line activating signal having a voltage level equal to or higher tan a source voltage and said ground terminal, wherein an output of an associated one of said decoding circuits is supplied to a gate of said first transistor and an inverted output of said associated one of said decoding circuits is supplied to a gate of said second transistor, and wherein a junction of said first transistor and said second transistor is connected to an associated one of said word lines.

6. The semiconductor memory circuit as claimed in claim 2, wherein said decoder circuit further comprises a precharge circuit for precharging an input point of each of said driving circuits to a source voltage.

7. The semiconductor memory circuit as claimed in claim 2, wherein each of said decoding circuits has a NOR circuit construction having a set of input terminals receiving said part of said set of address signals.

8. The semiconductor memory circuit as claimed in claim 2, wherein each of said decoding circuits has a NAND circuit construction having a set of input terminals receiving said part of said set of address signals.

9. A semiconductor memory circuit having a plurality of word lines, a decoder circuit coupled to said word lines and responsive to a set of address signals for selecting one of said word lines, and a sense amplifier responsive to a sense amplifier activating signal for amplifying data read out from a memory cell connected to said one of said word lines selected by said decoder circuit during an active level of said sense amplifier activating signal, said sense amplifier being deactivated during an inactive level of said sense amplifier activating signal, said decoder circuit comprising a plurality of decoding circuits individually provided for each of said word lines and having first and second circuit nodes, each of said decoding circuits responding to a part of said set of address signals and forming an electrical path between said first and second circuit nodes thereof when said part of said set of address signals has a predetermined combination in a logic level, a plurality of precharging transistors each connected between a power supply terminal and said first circuit node of an associated one of said decoding circuits and supplied with a precharge signal to precharge said first circuit node, a plurality of switching transistors each connected to a ground terminal and said second circuit node of said associated one of said decoding circuits and supplied with an inverted signal of said sense amplifier activating signal, each of said switching transistors being thereby rendered conductive during said inactive level of said sense amplifier activating signal to connect said second circuit node of each of said decoding circuits and nonconductive during said active level of said sense amplifier activating signal to disconnect said second circuit node of each of said decoding circuits, and a plurality of drive circuits each coupled between an associated one of said decoding circuits and an associated one of said word lines and selecting said associated one of said word lines when said associated one of said decoding circuits does not form said electrical path between said first and second circuit nodes, each of said decoding circuits being disconnected from said ground terminal when said sense amplifier amplifies said data.

10. The semiconductor memory circuit as claimed in claim 9, wherein each of said decoding circuits comprises a plurality of decoding transistors each having a gate supplied with one of said part of said set of address signals, said decoding transistors being connected in parallel to each other between said first and second circuit nodes.

11. The semiconductor memory circuit as claimed in claim 9, wherein each of said drive circuits comprises a series connection of a first drive transistor and a second drive transistor and an input terminal for a word line activating signal having a voltage level equal to or higher than a source voltage at said power supply terminal, said series connection being connected between said input terminal and said ground terminal, wherein a signal at said first circuit node of an associated one of said decoding circuits is supplied to a gate of said first drive transistor and an inverted signal of said signal at said first circuit node is supplied to a gate of said second drive transistor, and wherein a junction of said first drive transistor and said second drive transistor is connected to an associated one of said word lines.

* * * * *

UNITED STATES PATENT AND TRADEMARK OFFICE
CERTIFICATE OF CORRECTION

PATENT NO. : 5,323,357
DATED : June 21, 1994
INVENTOR(S) : Shouji KANEKO

It is certified that error appears in the above-identified patent and that said Letters Patent is hereby corrected as shown below:

Column 1, line 53, delete "0 V" and insert --0V--.
Column 5, line 41, delete "tan" and insert --than--.

Signed and Sealed this

Sixth Day of September, 1994

BRUCE LEHMAN

*Attest:*

*Attesting Officer*    *Commissioner of Patents and Trademarks*